US010497868B2

(12) United States Patent
Jameson, III et al.

(10) Patent No.: US 10,497,868 B2
(45) Date of Patent: Dec. 3, 2019

(54) MEMORY ELEMENTS HAVING CONDUCTIVE CAP LAYERS AND METHODS THEREFOR

(71) Applicant: Adesto Technologies Corporation, Santa Clara, CA (US)

(72) Inventors: John Ross Jameson, III, Menlo Park, CA (US); Jeffrey Allan Shields, Sunnyvale, CA (US); Kuei-Chang Tsai, Cupertino, CA (US)

(73) Assignee: Adesto Technologies Corporation, Santa Clara, CA (US)

( * ) Notice: Subject to any disclaimer, the term of this patent is extended or adjusted under 35 U.S.C. 154(b) by 0 days.

(21) Appl. No.: 15/480,673

(22) Filed: Apr. 6, 2017

(65) Prior Publication Data
US 2017/0279045 A1   Sep. 28, 2017

Related U.S. Application Data

(63) Continuation of application No. PCT/US2015/054234, filed on Oct. 6, 2015.

(60) Provisional application No. 62/061,124, filed on Oct. 7, 2014.

(51) Int. Cl.
*H01L 45/00* (2006.01)
*G11C 13/00* (2006.01)

(52) U.S. Cl.
CPC ...... *H01L 45/1253* (2013.01); *G11C 13/0011* (2013.01); *H01L 45/04* (2013.01); *H01L 45/085* (2013.01); *H01L 45/12* (2013.01); *H01L 45/1266* (2013.01); *H01L 45/16* (2013.01); *H01L 45/1608* (2013.01); *G11C 2213/50* (2013.01)

(58) Field of Classification Search
CPC ... H01L 45/1253; H01L 45/146; H01L 45/16; H01L 45/1233; H01L 45/08; H01L 27/2463
See application file for complete search history.

(56) References Cited

U.S. PATENT DOCUMENTS

| 5,761,115 | A | 6/1998 | Kozicki et al. |
| 6,063,692 | A * | 5/2000 | Lee ............... H01L 21/28105 257/E21.196 |
| 6,865,117 | B2 | 3/2005 | Kozicki |
| 6,998,312 | B2 | 2/2006 | Kozicki et al. |
| 7,345,295 | B2 | 3/2008 | Ufert |
| 7,402,770 | B2 * | 7/2008 | Sun ........................ B82Y 10/00 200/238 |
| 7,728,322 | B2 * | 6/2010 | Kozicki ............. H01L 27/2409 257/4 |
| 8,115,282 | B2 | 2/2012 | Mege |
| 8,426,839 | B1 | 4/2013 | Ma et al. |
| 8,427,860 | B2 | 4/2013 | Ohba et al. |
| 8,531,867 | B2 | 9/2013 | Gallo |

(Continued)

*Primary Examiner* — Nicholas J Tobergte

(57) ABSTRACT

A memory element can include a first electrode; at least one switching layer formed over the first electrode; a second electrode layer; and at least one conductive cap layer formed over the second electrode layer having substantially no grain boundaries extending through to the second electrode layer; wherein the at least one switching layer is programmable between different impedance states by application of electric fields via that first and second electrode. Methods of forming such memory elements are also disclosed.

17 Claims, 6 Drawing Sheets

(56) References Cited

U.S. PATENT DOCUMENTS

| | | | |
|---|---|---|---|
| 8,829,482 B1 | 9/2014 | Gallo et al. | |
| 8,866,122 B1 | 10/2014 | Lee et al. | |
| 9,099,633 B2 | 8/2015 | Gopalan et al. | |
| 9,252,359 B2 | 2/2016 | Jameson, III et al. | |
| 9,711,719 B2 | 7/2017 | Jameson et al. | |
| 2013/0221307 A1* | 8/2013 | Wang | H01L 45/10 257/2 |
| 2014/0151621 A1* | 6/2014 | Tendulkar | H01L 45/08 257/2 |

* cited by examiner

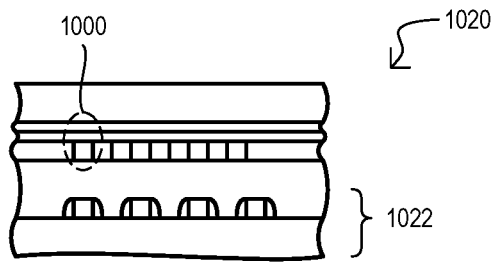
FIG. 10
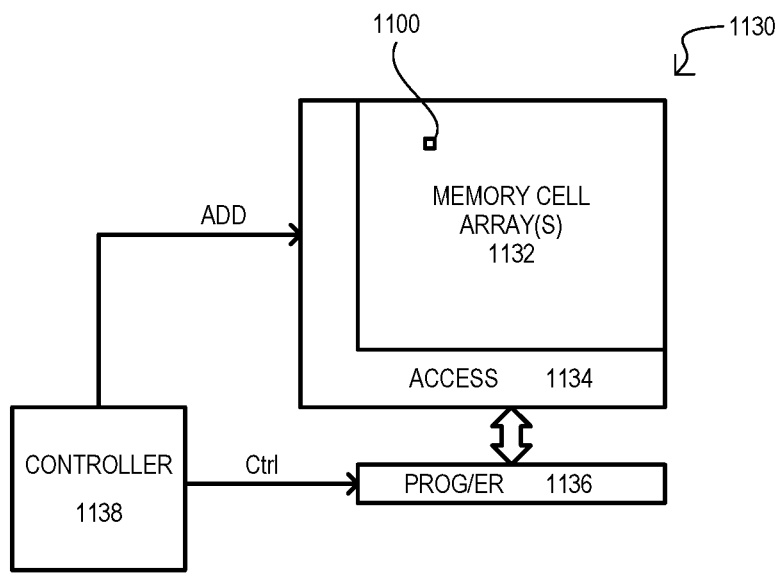
FIG. 11
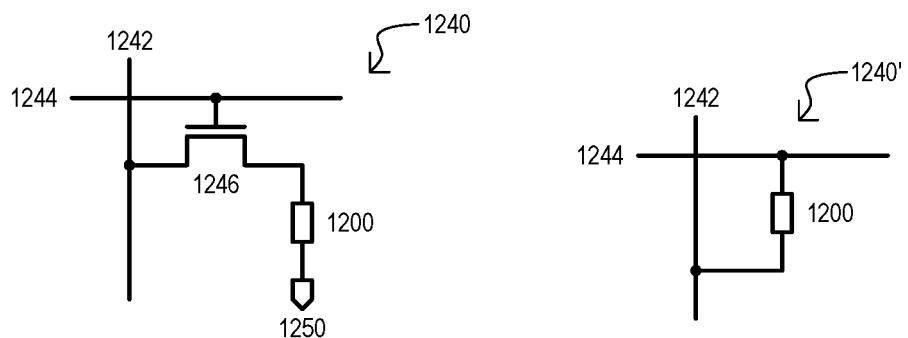
FIG. 12A
FIG. 12B (BACKGROUND)

US 10,497,868 B2

MEMORY ELEMENTS HAVING CONDUCTIVE CAP LAYERS AND METHODS THEREFOR

PRIORITY CLAIMS

This application is a continuation of Patent Cooperation Treaty (PCT) Application No. PCT/US2015/054234 filed Oct. 6, 2015, which claims the benefit of U.S. Provisional Patent Application No. 62/061,124 filed Oct. 7, 2014, the contents all of which are incorporated by reference herein.

TECHNICAL FIELD

The present disclosure relates generally to memory elements for storing data in electronic devices, and more particularly to memory elements that are programmable between different impedance states, including resistive random access memory (RRAM) type elements.

BACKGROUND

Some conventional resistive random access memory (RRAM) elements, including some CBRAM type elements, include a switching material formed between two electrodes, such as an anode and a cathode. Some conventional anode materials will oxidize when subject to an environment containing oxygen, such as air. Oxidation of an anode can increase its resistance or even prevent a conductive connection from being made to the memory element.

Conventionally, to prevent oxidation of an anode, a conductive "cap" layer can be formed over an anode to prevent it from oxidizing. In architectures that include a common conductive connection among multiple elements (e.g., a plate), a conductive cap can also advantageously decrease a resistance of the plate.

It can be desirable for the materials of RRAM/CBRAM elements to be compatible with existing CMOS fabrication processes. In particular, RRAM/CBRAM elements should be able to withstand anneals of at least 400° C. Preferably, materials of an RRAM/CBRAM can include those already used in a fabrication process. As a result, titanium nitride (TiN) or tantalum nitride (TaN) are used for a cap layer.

FIG. 13 is a side cross sectional view of a conventional element 1301. Element 1301 can include a cathode 1303, a switching layer 1305, an anode layer 1307 and a cap layer 1309. If a cap layer 1309 is formed from a material such as TiN or TaN, columnar grain structures can be formed, resulting in grain boundaries 1311 that can extend through the cap layer 1309 to the anode layer 1307. Such grain boundaries 1311 can allow oxygen and/or other contaminants from an atmosphere to penetrate down to material of the anode layer 1307. Grain boundaries (e.g., 1311') may be particularly problematic at locations in the cap layer 1309 corresponding to the corner of the cathode 1303, where a step might occur.

BRIEF DESCRIPTION OF DRAWINGS

FIG. 10 is a side cross sectional a view of an integrated circuit device according to an embodiment.

FIG. 11 is a block schematic diagram of an IC device according to another embodiment.

FIGS. 12A and 12B are schematic diagrams of memory cells according to embodiments.

DETAILED DESCRIPTION OF THE EMBODIMENTS

Figure 1:
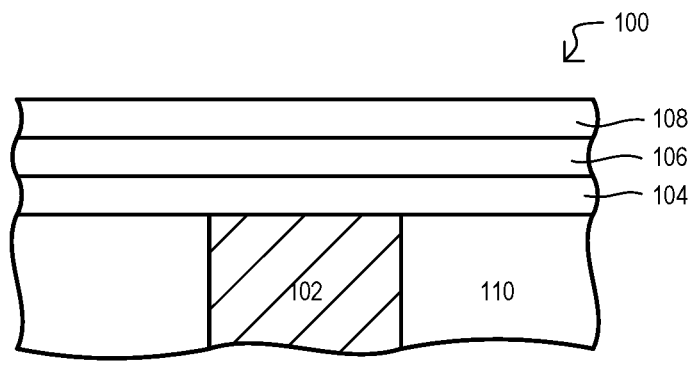
FIG. 1 is a side cross sectional view of a memory element according to an embodiment.

Embodiments can include memory elements, devices including such elements, and methods for making elements in which one or more conductive cap layers can be formed over an electrode of a memory element. The cap layers can include few, if any, grain boundaries that extend through to the underlying electrode. In some embodiments, cap layers can include at least one layer that is conductive and amorphous. Other embodiments can include combinations of layers, including one that is amorphous and one that includes grain boundaries.

In some embodiments, an amorphous layer of a conductive cap can have the composition $M_xSe_yQ_z$ where M is an early transition metal, Se is a semiconductor or semimetal, and Q is nitrogen or oxygen.

In other embodiments, a conductive cap layer can be, or can include, a layer of an amorphous silicide.

In further embodiments, a conductive cap layer can include a first layer having grain boundaries in contact with a second layer having grain boundaries, with the majority of the first layer grain boundaries not being vertically aligned with the second layer grain boundaries.

Other embodiments can include methods of forming such memory elements, and devices including such memory elements.

In the various figures, like items are referred to the same reference character but with the leading digit(s) corresponding to the figure number.

FIG. 1 is a side cross sectional view of a memory element 100 according to an embodiment. A memory element 100 can include a first electrode 102, a switching layer 104, a second electrode layer 106, and a cap layer 108. A first electrode 102 can be formed in an insulating layer 110, and in some embodiments, can be a cathode of a CBRAM type element.

A switching layer 104 can provide a change in impedance in response to the application of electric fields. In some embodiments, application of an electric field in one direction can result in a first type resistance change (e.g., a higher resistance), while an electric field in the opposite direction can result in a second type resistance change (e.g., a lower resistance). In some embodiments, a switching layer can change resistance through an oxidation-reduction reaction. Such a reaction may, or may not include ion conduction.

While a switching layer 104 can include any suitable material, in embodiments, a switching layer can include a metal oxide layer and/or a chalcogenide.

It is understood that a switching layer 104 can be a compound layer, being formed of more than one layer.

In some embodiments, a second electrode layer 106 can be an anode of a CBRAM type element. In embodiments, a second electrode layer 106 can include one or more elements that are capable of ion conducting in the switching layer 104.

A cap layer 108 can include, or can be, an amorphous layer that essentially includes no grain boundaries. In some embodiments, amorphous cap layer 108 can be an amorphous silicide. In one embodiment, an amorphous cap layer 108 can be a tantalum silicide $Ta_xSi_y$. Tantalum silicide can advantageously use materials commonly present in existing fabrication processes.

In addition or alternatively, a cap layer 108 can include, or be, a conductive mictamict alloy. In some embodiments, a mictamict alloy can have the composition $M_xSe_yQ_z$, where M is an early transition metal, Se is semiconductor or semimetal, and Q is nitrogen (N) or oxygen (O). Early transition metals are of groups IIIB, IVB, VB and VIB of the Periodic Table. In more particular embodiments, M can be any of: scandium (Sc), titanium (Ti), zirconium (Zr), vanadium (V), chromium (Cr), yttrium (Y), lanthanum (La), niobium (Nb), molybdenum (Mo), hafnium (Hf), tantalum (Ta) or tungsten (W). According to some embodiments, Se can be any of: silicon (Si), germanium (Ge) or boron (B).

Very particular examples of mictamict alloy nitrides that may be included in a cap layer according to embodiments are: $Ta_xSi_yN_z$, which in a particular example can be $Ta_{36}Si_{14}N_{50}$, or a compound having a similar stoichiometry; $Mo_xSi_yN_z$, where particular examples can include x/y/z being about 35/17/48, 36/17/47, or a compound having a similar stoichiometry; $W_xSi_yN_z$, where particular examples can include x/y/z being about 24/36/40, 24/38/38, 36/14/50, 41/17/42 or a compound having a similar stoichiometry; $W_xB_yN_z$, where particular examples can include x/y/z being about 42/17/41, 64/20/16 or a compound having a similar stoichiometry; or $Ti_xSi_yN_z$ which in a particular example can be $Ti_{34}Si_{23}N_{43}$, or a compound having a similar stoichiometry. These or additional examples are understood from, "Amorphous Ternary Diffusion Barriers for Silicon Metallizations" by Jason S. Reid, a Thesis submitted to the California Institute of Technology, dated 1995 (herein after Reid), the contents of which are incorporated herein. It is understood however, that these particular compositions are provided by way of example only, and should not necessarily be construed as limiting.

Very particular examples of mictamict alloy oxides that may be used in a cap layer according to embodiments may include: $Ti_xSi_yO_z$, where particular examples of x/y/z can be about 3/1/8, 25/8/67, or a compound having a similar stoichiometry; or $Ru_xSi_yO_z$. These or additional examples are understood from, "Thermal Stability of amorphous Ti3Si1O8 thin films" by P. H. Giauque et al., Microelectronic Engineering 55 (2001) 183-188 (hereinafter Giauque et al.), the contents of which are incorporated herein. It is understood however, that these particular compositions are provided by way of example only, and should not necessarily be construed as limiting.

According to some embodiments, an amorphous cap layer 108 can remain amorphous through anneals greater than 400° C., and thus can be suitable for existing fabrication processes, including CMOS fabrication processes.

Figure 2:
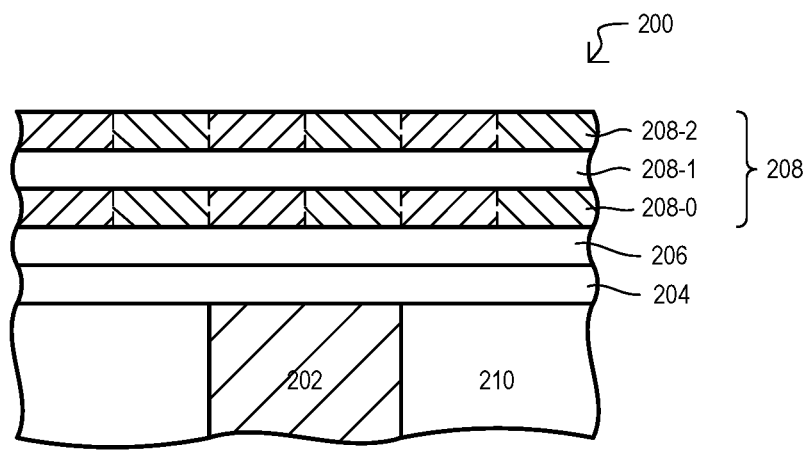
FIG. 2 is a side cross sectional view of a memory element according to another embodiment.

FIG. 2 is a side cross sectional view of a memory element 200 according to an embodiment. A memory element 200 can include items like those of FIG. 1, and such like items can be subject to the same variations as noted for FIG. 1.

FIG. 2 differs from FIG. 1 in that a cap layer 208 can be a compound layer formed by layers 208-0 to -2. Layer 208-0 can be in contact with the second electrode layer 206, and can include grain boundaries. Similarly, a top layer 208-2 can include grain boundaries. However, layer 208-1 formed between layers 208-0 and 208-2 can be an interrupting layer that limits or prevents vertical grain boundaries in layer 208-2 from aligning with those of 208-0.

Grain boundary containing layers 208-0 and 208-2 can be formed of any suitable conductive material, preferably those available in, or compatible with, an existing fabrication process.

In some embodiments, interrupting layer 208-1 can be a material having a different grain structure than that of layers 208-0 and 208-2. In some embodiments, interrupting layer 208-1 can be a metal formed of a single element, while layers 208-0 and 208-2 can be compound materials. In one very particular embodiment, layers 208-0 and 208-2 can be TaN and interrupting layer 208-1 can be Ta.

In other embodiments, interrupting layer 208-1 can be an amorphous layer. In such embodiments, interrupting layer 208-1 can be formed of any suitable amorphous material as described herein, or an equivalent.

Figure 3:
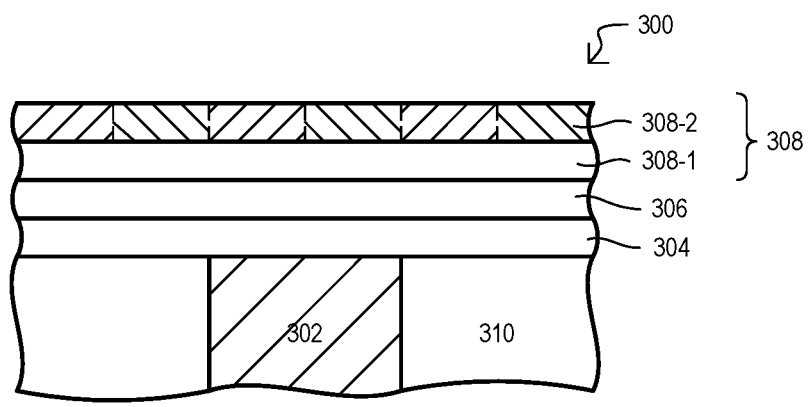
FIG. 3 is a side cross sectional view of a memory element according to a further embodiment.

FIG. 3 is a side cross sectional view of a memory element 300 according to an embodiment. A memory element 300 can include items like those of FIG. 2, and such like items can be subject to the same variations as noted for FIG. 2.

FIG. 3 differs from FIG. 2 in that compound cap layer 308 is formed by two layer 308-1 to -2. Layer 308-1 can be in contact with the second electrode layer 306, and can be an interrupting layer as described for the embodiment of FIG. 2, or an equivalent.

Layer 308-2 can include grain boundaries. However, layer 308-1 can limit or prevent such grain boundaries from extending to second electrode layer 306.

Figure 4:
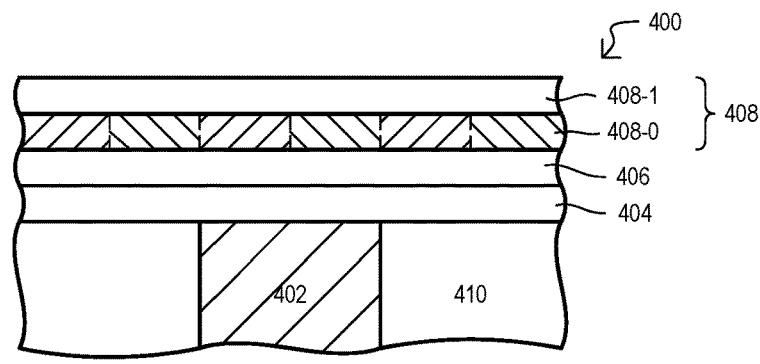
FIG. 4 is a side cross sectional view of a memory element according to another embodiment.

FIG. 4 is a side cross sectional view of a memory element 400 according to an embodiment. A memory element 400 can include items like those of FIG. 2, and such like items can be subject to the same variations as noted for FIG. 2.

FIG. 4 differs from FIG. 2 in that compound cap layer 408 is formed by two layers 408-0 to -1. Layer 408-0 can be in contact with the second electrode layer 406, and can include grain boundaries.

Layer 408-1, formed over layer 408-0, can be an interrupting layer as described for the embodiment of FIG. 2, or an equivalent. Accordingly, interrupting layer 408-1 can limit or prevent undesirable species from passing through to the grain boundaries of underlying layer 408-0 (and hence possibly on to second electrode layer 406).

Figure 5:
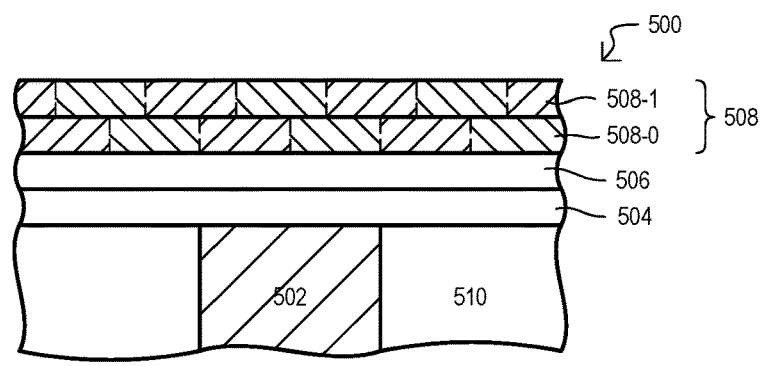
FIG. 5 is a side cross sectional view of a memory element according to another embodiment.

FIG. 5 is a side cross sectional view of a memory element 500 according to an embodiment. A memory element 500 can include items like those of FIG. 2, and such like items can be subject to the same variations as noted for FIG. 2.

FIG. 5 differs from FIG. 2 in that compound cap layer 508 is formed by two layers 508-0 and -1. Layer 508-0 can be in contact with the second electrode layer 506, and can include grain boundaries.

Layer 508-1 can be formed over and in contact with layer 508-0. Layer 508-1 can also include grain boundaries, however, the majority of such grain boundaries are not vertically aligned with those of the underlying layer 508-0. Accordingly, while undesirable elements may propagate through grain boundaries of layer 508-1, due to the vertical misalignment of grain boundaries, most of the elements will not propagate through layer 508-0 on to second electrode layer 506.

Figure 6A:
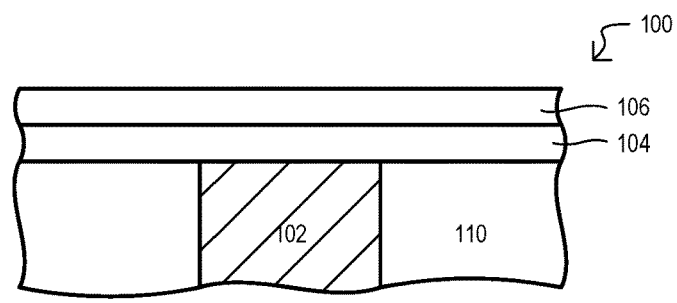
FIGS. 6A and 6B are side cross sectional views showing a method of making a memory element like that of FIG. 1.
Figure 6B:
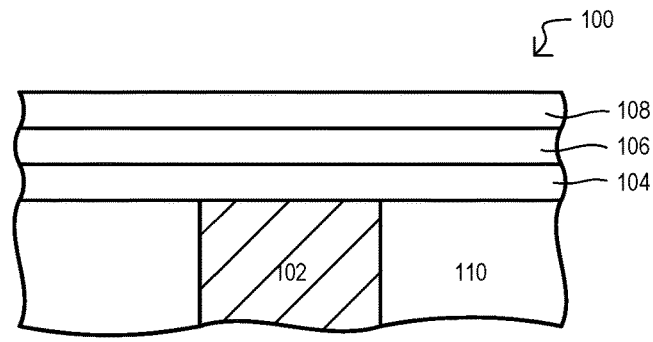

FIGS. 6A and 6B are a sequence of side cross sectional views showing a method of making an element like that shown in FIG. 1, according to embodiments.

Referring to FIG. 6A, a method can include forming a first electrode 102 in an insulating layer 110. In some embodiments, such an action can include any suitable process steps, including contact and/or via forming steps. In some embodiments, once first electrode 102 is formed, it can be subject to additional cleaning steps and/or treatment steps. Treatment steps can include those that can alter a surface of first electrode 102, including but not limited to, oxidation steps, implantation steps, or electrolysis steps. As noted in the description of FIG. 1, in some embodiments a first electrode 102 can be a cathode of a CBRAM type element.

Following the formation of first electrode 102, a switching layer 104 can be formed over the first electrode 104. In particular embodiments, switching layer 104 can be in contact with first electrode 104. A switching layer 104 can be subject to the variations noted for FIG. 1, and can be formed with any suitable process steps. In some embodiments, a switching layer 104 can formed by sputtering (including reactive sputtering), oxidizing, or combinations thereof. However, such particular fabrication steps should not be construed as limiting.

Following the formation of switching layer 104, a second electrode layer 106 can be formed over the switching layer 104. In particular embodiments, second electrode layer 106 can be in contact with switching layer 104. A second electrode layer 106 be subject to the variations noted for FIG. 1, and can be formed with any suitable process steps. In some embodiments, a second electrode layer 106 can formed by sputtering (including reactive sputtering). However, such a particular fabrication step should not be construed as limiting. As noted in the description of FIG. 1, in some embodiments a second electrode 106 can be an anode of a CBRAM type element. FIG. 6A shows an element 100 following the formation of second electrode layer 106.

Referring to FIG. 6B, following the formation of second electrode layer 106, a cap layer 108 can be formed over the second electrode layer 106. In particular embodiments, cap layer 108 can be in contact with second electrode layer 106.

A cap layer 108 can be subject to the variations noted for FIG. 1, and can be formed with any suitable process steps. In particular embodiments, a cap layer 108 can be formed by sputtering. In more particular embodiments, a cap layer 108 can be formed by reactive sputtering with one or more targets. The target(s) can provide one or more elements of the resulting cap layer while a flowing gas can provide one or more other elements of the resulting cap layer.

In more particular embodiments, a cap layer 108 can be an amorphous compound $M_xSe_yQ_z$, described with reference to FIG. 1, and constituents M and Se are provided by one or more sputtering targets, while constituent Q is provided by a gas flowing in the sputtering chamber. In particular embodiments, such sputtering targets can be metal silicide and/or metal boride targets, and a gas flowing in the reaction chamber can include nitrogen gas ($N_2$) and/or oxygen gas ($O_2$). However, alternate embodiments can utilize other gases that include nitrogen and/or oxygen.

In some very particular embodiments, an amorphous cap layer 108 can be formed by reactive sputtering at a frequency of about 10-20 MHz, with a power of about 50-2000 W, and at a pressure of about 0.1 mTorr to 10 mTorr. Metal silicide or metal boride targets can be used, including but not limited to targets of: $Mo_3Si_3$, $Ta_5Si_3$, $Ti_5Si_3$, $W_5Si_3$, $WSi_2$ or $W_2B$. Argon (Ar) gas can flow into the chamber at about 10-80 sccm with nitrogen gas ($N_2$).

In other very particular embodiments, an amorphous cap layer 108 can be formed by reactive sputtering with a target of $Ti_3Si$ and a gas flow of Ar and $O_2$. Other very particular examples and variations are understood from Reid and Giauque et al., incorporated by reference above.

Figure 7A:
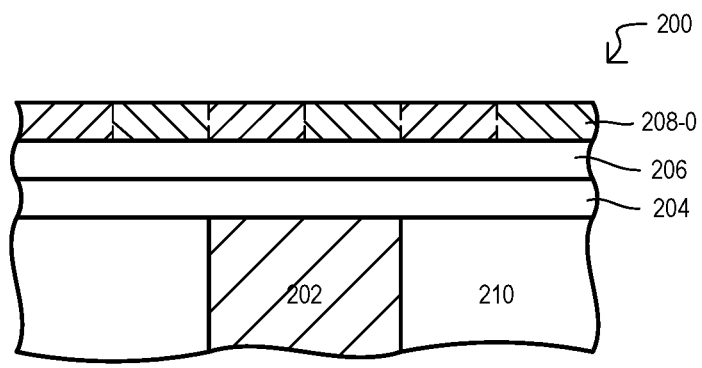
FIGS. 7A to 7C are side cross sectional views showing a method of making a memory element like that of FIG. 2 or 4.
Figure 7B:
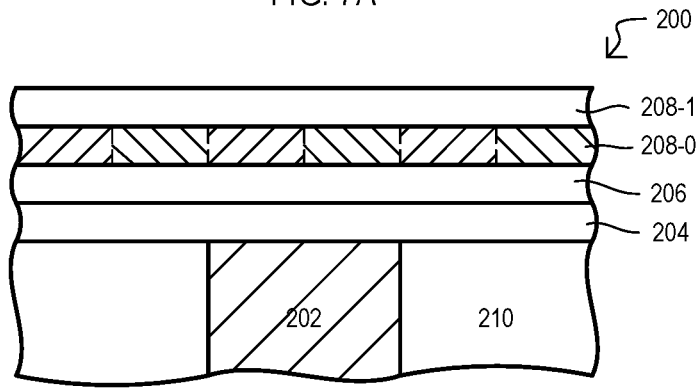
Figure 7C:
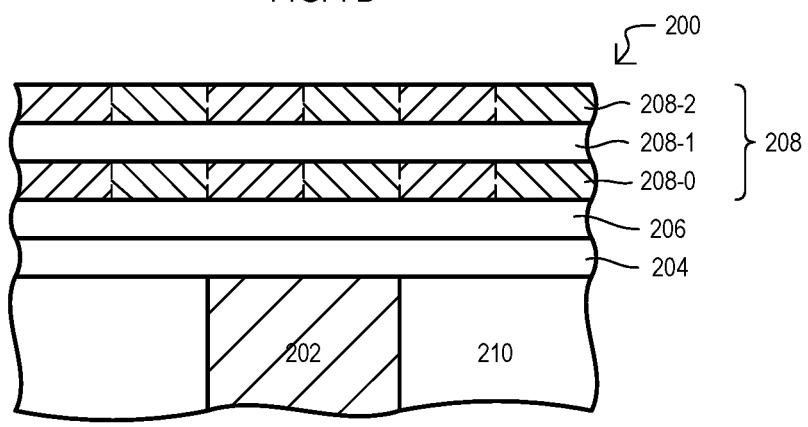

FIGS. 7A to 7C are a sequence of side cross sectional views showing a method of making an element like that shown in FIG. 2 or 4, according to embodiments. It is understood that FIGS. 7A to 7C occur after a device has been fabricated according to FIG. 6A.

Referring to FIG. 7A, following the formation of second electrode layer 206, a first layer 208-0 of a compound cap layer 208 can be formed. In particular embodiments, layer 208-0 can be in contact with second electrode layer 206. A layer 208-0 can be subject to the variations noted for FIG. 2, and can be formed with any suitable process steps. Preferably, layer 208-0 can be a conductive film available in, or compatible with, an existing fabrication process. In one very particular embodiment, layer 208-0 can be TaN formed by deposition, including but not limited to: atomic layer deposition, sputtering (including reactive sputtering), or chemical vapor deposition (CVD) (including plasma enhanced CVD).

Referring to FIG. 7B, following the formation of grain boundary containing layer 208-0, an interrupting layer 208-1 of a compound cap layer 208 can be formed. In particular embodiments, interrupting layer 208-1 can be in contact with lower layer 208-0. Interrupting layer 208-1 can be subject to the variations noted for FIG. 2, and can be formed with any suitable process steps.

In particular embodiments, an interrupting layer 208-1 can be a pure metal layer. In particular embodiments, interrupting layer 208-1 can be metal formed by deposition, including but not limited to: atomic layer deposition, sputtering (including reactive sputtering), or chemical vapor deposition (CVD) (including plasma enhanced CVD). In one very particular embodiment, interrupting layer 208-1 can be a layer of Ta.

As noted for FIG. 2, in other embodiments, an interrupting layer 208-1 can be an amorphous layer. In such embodiments, amorphous interrupting layer 208-1 can be fabricated like cap layer 108 described with reference to FIG. 6B, or any equivalent process and/or material.

It is noted that following the formation of interrupting layer 208-1, a memory cell 200 can have the form of that shown in FIG. 4.

Referring to FIG. 7C, following the formation of interrupting layer 208-1, another grain boundary containing layer 208-2 can be formed. In particular embodiments, layer 208-2 can be in contact with interrupting layer 208-1. Layer 208-2 can be formed with the same or equivalent processes used to form layer 208-0.

In some embodiments, layers 208-0 and 208-2 can be a same material formed with same conditions, but a separate fabrication step. However, in other embodiments, layers 208-0 and 208-2 can be a same material formed with different process conditions or different materials entirely.

Figure 8A:
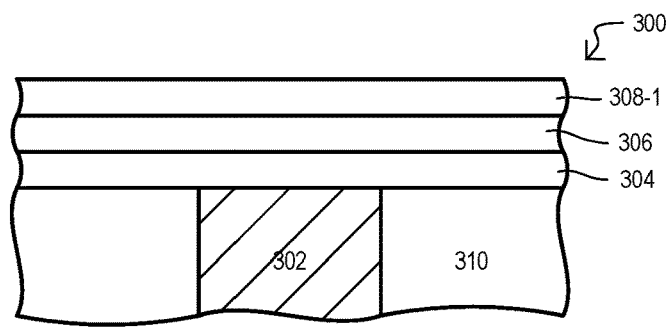
FIGS. 8A and 8B are side cross sectional views showing a method of making a memory element like that of FIG. 3.
Figure 8B:
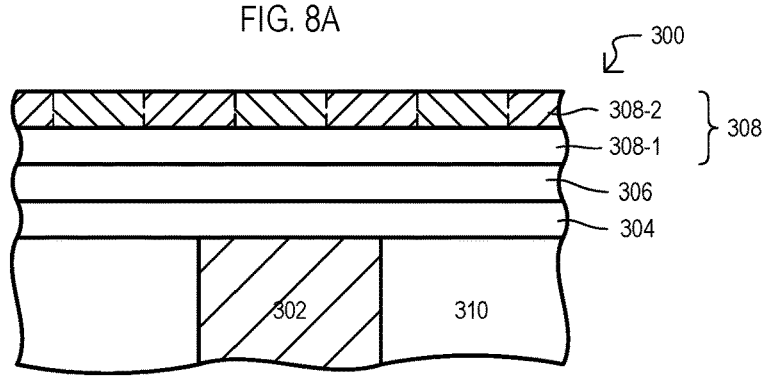

FIGS. 8A and 8B are a sequence of side cross sectional views showing a method of making an element like that shown in FIG. 3, according to embodiments. It is understood that FIGS. 8A and 8B occur after a device has been fabricated according to FIG. 6A.

Referring to FIG. 8A, following the formation of second electrode layer 306, an interrupting layer 308-1 of a compound cap layer 308 can be formed. In particular embodiments, interrupting layer 308-1 can be in contact with second electrode layer 306. Interrupting layer 308-1 can be fabricated according to any of the methods described for layer 208-1 in FIG. 7B, or equivalents.

Referring to FIG. 8B, following the formation of interrupting layer 308-1, a grain boundary containing layer 308-2 can be formed. In particular embodiments, layer 308-2 can be in contact with interrupting layer 308-1. Layer 308-2 can be formed with the same or equivalent processes used to form layer 208-0, described in conjunction with FIG. 7A.

Figure 9A:
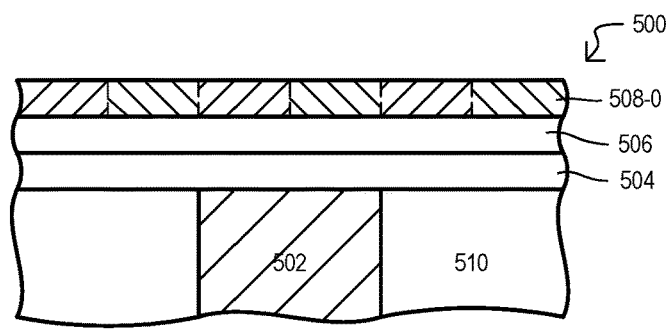
FIGS. 9A and 9B are side cross sectional views showing a method of making a memory element like that of FIG. 5.
Figure 9B:
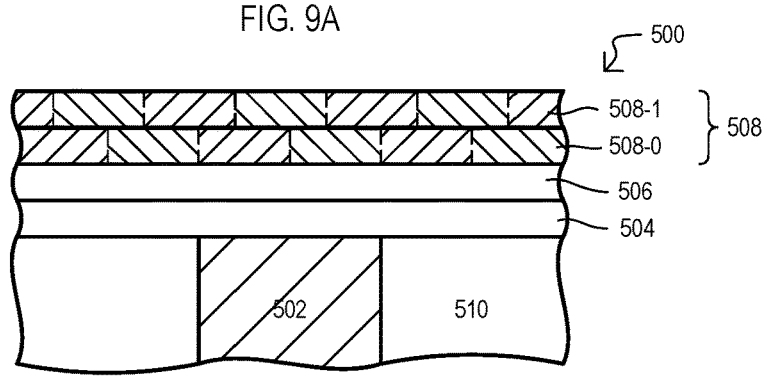
Figure 13:
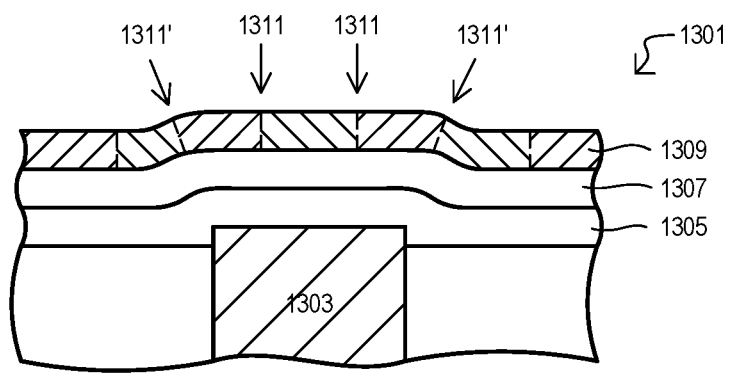
FIG. 13 is a side cross sectional view of a conventional memory element.

FIGS. 9A and 9B are a sequence of side cross sectional views showing a method of making an element like that shown in FIG. 5, according to embodiments. It is understood that FIGS. 9A and 9B occur after a device has been fabricated according to FIG. 6A.

Referring to FIG. 9A, following the formation of second electrode layer 506, a grain boundary containing layer 508-0 of a compound cap layer 508 can be formed. In particular embodiments, grain boundary containing layer can be in contact with second electrode layer 506. Grain boundary containing layer 508-0 can be fabricated according to any of the methods described for layer 208-0 in FIG. 7A, or equivalents.

Referring to FIG. 9B, following the formation of grain boundary containing layer 508-0, a second grain boundary containing layer 508-1 can be formed. In particular embodiments, second layer 508-1 can be in contact with first layer 508-0. According to embodiments, second layer 508-1 can be formed with a separate process step than that used to form first layer 508-0. As a result, vertical grain boundaries of such layers can be misaligned. In other embodiments, materials used for first and second layers 508-0/1 can be different, particularly in grain structure, to reduce or minimize the formation, or possibility of forming a vertical grain boundary path through both layers 508-0/1 to second electrode layer 506. Layer 508-1 can be formed with the same or equivalent processes used to form layer 208-2, described in conjunction with FIG. 7C.

FIG. 10 is a side cross sectional view of an integrated circuit (IC) device 1020 according to an embodiment. IC device 1020 can include programmable impedance elements (one shown as 1000) as described herein, or equivalents. A device 1020 can include CMOS transistors 1022 manufactured with a CMOS fabrication process. Elements (e.g., 1000) can include a cap layer, as described herein or equivalents, that provides protection to electrode layers from contamination caused by undesired elements, such as oxygen, which can oxidize an electrode layer, for example. At the same time, cap layer(s) for such elements (e.g., 1000) can maintain protective properties (e.g., remain amorphous) throughout the various steps of the CMOS fabrication process used to create the IC device 1020.

In this way, an IC device 1020 fabricated with a CMOS process can advantageously include elements (such as CBRAM or other RRAM) elements that have increased protection from undesired elements.

FIG. 11 is a block diagram of an IC device 1130 according to another embodiment. An IC device 1130 can include one or more memory cell arrays 1132, access circuits 1134, program/erase circuits 1136, and a controller 1138. Memory cell array(s) 1132 can include memory cells that each include one or more programmable impedance elements (one shown as 1100) as described herein or equivalents. Thus, memory cell array(s) 1132 include elements (e.g., 1100) that are resistant to undesired contaminants, but at the same time compatible with CMOS processes.

Access circuits 1134 can enable access to memory cells according to address values. In some embodiments, access circuits 1134 can include decoder circuits, including row and/or column decoders. In some embodiments, access circuits 1134 can also provide limited access to some memory cells (e.g., boot blocks or the like).

Program/erase circuits 1136 can set an impedance of elements (e.g., 1100) of memory cells by application of an electric field through access circuits 1134. In some embodiments, memory cells within array(s) 1132 can be erased to a high resistance than selectively programmed to one or more lower resistances according to a data value to be stored. However, in other embodiments, memory cells can be erased to a low resistance and selectively programmed to a high resistance. In the embodiment shown, program and erase operations can be controlled according to control inputs Ctrl.

A controller 1138 can control program and erase operations. In particular, controller 1138 can provide control inputs Ctrl to program/erase circuits 1136.

FIGS. 12A and 12B are schematic diagrams of memory cells according to embodiments. FIG. 12A shows a "1T-1R" type memory cell 1240 that can include an access device 1246 and an element 1200, as described herein or equivalents. In some embodiments, an access device 1246 can be a transistor manufactured with a CMOS process. In particular embodiments, an access device 1246 can be an n-channel CMOS type transistor. Access device 1246 can be controlled by a control line 1244 (e.g., word line).

A first terminal of element 1200 can be connected to an access line 1242 (e.g., a bit line) via access device 1246. A second terminal of element 1200 can be connected to a node 1250. In some embodiments, a second terminal of element 1200 can be an anode, and node 1250 can be a plate common to many anodes of other elements.

FIG. 12B shows a crossbar type memory cell 1240'. In such an arrangement, a first terminal of element 1200 can be connected to a first line 1244 (e.g., a bit line) while a second terminal of element 1200 can be connected to a second line 1244 (e.g., word line).

It should be appreciated that reference throughout this description to "one embodiment" or "an embodiment" means that a particular feature, structure or characteristic described in connection with the embodiment is included in at least one embodiment of an invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

It is also understood that other embodiments of this invention may be practiced in the absence of an element/step not specifically disclosed herein.

Similarly, it should be appreciated that in the foregoing description of exemplary embodiments of the invention, various features of the invention are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claims require more features than are expressly recited in each claim. Rather, inventive aspects lie in less than all features of a single foregoing disclosed embodiment. Thus, the claims following the detailed description are hereby expressly incorporated into this detailed description, with each claim standing on its own as a separate embodiment of this invention.

What is claimed is:

1. A memory element comprising:
   a first electrode;
   at least one switching layer formed over the first electrode;
   a second electrode layer; and
   at least one conductive cap layer formed over the second electrode layer having substantially no grain boundaries extending through to the second electrode layer; wherein
   the at least one switching layer is programmable between different impedance states by application of electric fields via the first electrode and the second electrode layer,
   the at least one conductive cap layer comprises at least one amorphous layer and a further layer having grain boundaries.

2. The memory element of claim 1, wherein the at least one amorphous layer includes a layer of an amorphous silicide.

3. The memory element of claim 1, wherein the at least one amorphous layer includes a layer of a mictamict alloy.

4. The memory element of claim 1, wherein the at least one amorphous layer has the composition $M_xSe_yQ_z$ where M is an early transition metal, Se is a semiconductor or semimetal, and Q is nitrogen or oxygen.

5. The memory element of claim 4, wherein the M is selected from the group of: scandium (Sc), titanium (Ti), vanadium (V), chromium (Cr), yttrium (Y), zirconium (Zr), niobium (Nb), molybdenum (Mo), hafnium (Hf), tantalum (Ta), tungsten (W) and lanthanum (La).

6. The memory element of claim 4, wherein the Se is selected from the group of: silicon (Si), germanium (Ge) and boron (B).

7. The memory element of claim 1, further including:
   the at least one amorphous layer is in contact with the second electrode layer, and
   the further layer having grain boundaries is formed over the at least one amorphous layer.

8. The memory element of claim 1, further including:
   the further layer having grain boundaries is in contact with the second electrode layer, and
   the at least one amorphous layer is formed over the further layer.

9. The memory element of claim 8, further including an upper layer having grain boundaries formed over the at least one amorphous layer.

10. A memory element comprising:
    a first electrode;
    at least one switching layer formed over the first electrode;
    a second electrode layer; and
    at least one conductive cap layer formed over the second electrode layer having substantially no grain boundaries extending through to the second electrode layer; wherein
    the at least one switching layer is programmable between different impedance states by application of electric fields via the first electrode and the second electrode layer, and
    the at least one conductive cap layer includes a first layer having grain boundaries in contact with a second layer having grain boundaries, and the majority of the first layer grain boundaries are not vertically aligned with the second layer grain boundaries.

11. The memory element of claim 1, wherein the second electrode is an anode that includes at least one element that can ion conduct in the at least one switching layer.

12. A method, comprising:
    forming a first electrode;
    forming at least one switching layer over the first electrode that is programmable between different impedance states by application of electric fields;
    forming a second electrode layer; and
    forming at least one conductive cap layer over the second electrode layer having substantially no grain boundaries extending through to the second electrode layer; wherein
    the at least one switching layer is programmable between different impedance states by application of electric fields via the first electrode and the second electrode layer, and
    forming the at least one conductive cap layer includes
       forming a layer having grain boundaries, and
       forming at least one amorphous layer.

13. The method of claim 12, wherein forming at least one amorphous layer includes forming a layer of a mictamict alloy.

14. The method of claim 13, wherein the mictamict alloy has the composition $M_xSi_yQ_z$ where M is an early transition metal, Si is silicon, and Q is nitrogen or oxygen.

15. The method of claim 14, wherein forming the layer of the mictamict alloy includes reactive sputtering the M and Si component with a gas that includes the Q component.

16. The method of claim 12, wherein the location of the amorphous layer is selected from: over the layer having grain boundaries and under the layer having grain boundaries.

17. A method, comprising:
    forming a first electrode;
    forming at least one switching layer over the first electrode that is programmable between different impedance states by application of electric fields;
    forming a second electrode layer; and
    forming at least one conductive cap layer over the second electrode layer having substantially no grain boundaries extending through to the second electrode layer; wherein
    the at least one switching layer is programmable between different impedance states by application of electric fields via the first electrode and the second electrode layer, and
    forming the at least one conductive cap layer includes
       forming a first layer having grain boundaries over and in contact with the second electrode layer, and
       forming a second layer having grain boundaries over and in contact with the first layer with a processing step separate from that which forms the first layer; wherein
    the majority of the first layer grain boundaries are not vertically aligned with the second layer grain boundaries.

* * * * *